(12) United States Patent
Koresawa et al.

(10) Patent No.: US 8,765,503 B2
(45) Date of Patent: Jul. 1, 2014

(54) METHOD FOR FABRICATING ORGANIC EL DEVICE

(71) Applicant: Panasonic Corporation, Osaka (JP)

(72) Inventors: Kouhei Koresawa, Nara (JP); Yuji Tanaka, Osaka (JP); Takashi Ohta, Osaka (JP)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 13/693,511

(22) Filed: Dec. 4, 2012

(65) Prior Publication Data

US 2013/0095592 A1 Apr. 18, 2013

Related U.S. Application Data

(63) Continuation of application No. PCT/JP2011/004043, filed on Jul. 15, 2011.

(30) Foreign Application Priority Data

Jul. 16, 2010 (JP) .................................. 2010-162152

(51) Int. Cl.
   *H01L 23/14* (2006.01)
(52) U.S. Cl.
   USPC ................. 438/32; 438/26; 438/118
(58) Field of Classification Search
   CPC .................................................. H01L 33/486
   USPC ............................................. 438/3, 26, 118
   See application file for complete search history.

(56) References Cited

U.S. PATENT DOCUMENTS

2008/0078991 A1* 4/2008 Kim ............................... 257/40

FOREIGN PATENT DOCUMENTS

| JP | 2001-247961 | | 9/2001 |
|---|---|---|---|
| JP | 2003037154 A | * | 2/2003 |
| JP | 2003-173872 | | 6/2003 |
| JP | 2006-117800 | | 5/2006 |
| JP | 2008-084819 | | 4/2008 |
| JP | 2008-123948 | | 5/2008 |
| JP | 2009-283296 | | 12/2009 |

OTHER PUBLICATIONS

International Search Report in International Patent Application No. PCT/JP2011/004043, dated Aug. 30, 2011.

* cited by examiner

*Primary Examiner* — George Fourson, III
(74) *Attorney, Agent, or Firm* — Greenblum & Bernstein, P.L.C.

(57) ABSTRACT

Forming an adhesive layer on a part of a surface of the flexible substrate; forming a magnetic material layer on the surface of the flexible substrate in a part other than the part on which the adhesive layer is formed; temporarily holding, using magnetic force, the flexible substrate on which the adhesive layer and the magnetic material layer are formed, above an inflexible substrate having magnetic property; fixing the flexible substrate with the inflexible substrate via the adhesive layer; forming a layer composing an organic EL unit on the flexible substrate temporarily held using the magnetic force and fixed via the adhesive layer; removing the part in which the flexible substrate and the inflexible substrate are fixed via the adhesive layer; separating the flexible substrate from the inflexible substrate; and separating the magnetic material layer from the flexible substrate separated from the inflexible substrate are included.

7 Claims, 8 Drawing Sheets

METHOD FOR FABRICATING ORGANIC EL DEVICE

CROSS REFERENCE TO RELATED APPLICATIONS

This is a continuation application of PCT Patent Application No. PCT/JP2011/004043 filed on Jul. 15, 2011, designating the United States of America, which is based on and claims priority of Japanese Patent Application No. 2010-162152 filed on Jul. 16, 2010. The entire disclosures of the above-identified applications, including the specifications, drawings and claims are incorporated herein by reference in their entirety.

TECHNICAL FIELD

One or more exemplary embodiments disclosed herein relate generally to a method for fabricating an organic electroluminescence (EL) device having a flexible substrate.

BACKGROUND ART

In recent years, flexible displays which can be bent freely have been attracting attention. Majority of the flexible displays use an organic EL unit such as an organic light-emitting diode.

When fabricating the flexible displays, it is necessary to form the organic EL unit and others on a flexible substrate which can be bent freely. As a method for forming the organic EL unit on the flexible substrate, there is a method in which the organic EL unit is formed on the flexible substrate while the inflexible substrate such as glass is bonded to the flexible substrate using adhesive or others.

With this method, when the flexible substrate is separated from the inflexible substrate after the organic EL unit is formed, it is necessary to peel off the flexible substrate from the inflexible substrate with a force larger than the adhering force. Accordingly, there is a possibility that the flexible substrate is damaged, or the organic EL unit formed on the flexible substrate is broken.

In order to solve the problem, the patent literature 1 (hereafter referred to as the conventional art A) discloses a technique for temporarily fixing a flexible substrate on which a magnetic film is formed (flexible substrate) on a substrate holder (inflexible substrate), using magnetic force.

CITATION LIST

Patent Literature

[Patent Literature 1] Japanese Unexamined Patent Application Publication No. 2003-173872

SUMMARY

Technical Problem

However, with the conventional technology A, even after the flexible substrate and the inflexible substrate are separated, the magnetic film remains in the flexible substrate. Accordingly, the finished flexible device is also affected by the physical property of the magnetic film.

More specifically, depending on the thickness of the magnetic film and the composition of the magnetic material composing the magnetic film, the flexural strength is reduced, making the flexible device prone to cracking, and the transparency is reduced. This causes problems of lowered flexibility on the finished flexible device and a limit on the extraction of the emitted light from the finished flexible device.

Furthermore, when a thin flexible substrate is formed, the distance between the magnetic film formed on one side of the flexible substrate and the thin-film transistor (TFT) electrodes formed on the other side of the flexible substrate becomes shorter. This generates interlayer capacitance, which could be a cause of noise or delayed signals.

Furthermore, in a configuration in which the flexible display composed by using a flexible substrate is embedded in a case as a display unit of a terminal, if the film of the magnetic material is peeled, the magnetic material contacts electric parts in the case, causing malfunction, heat, or fire.

Furthermore, after the magnetic film is separated from the inflexible substrate, the flexible substrate is curved due to the stress on the remaining magnetic film. This causes a problem in securing the flatness of the finished flexible device.

One non-limiting and exemplary embodiment provides a method for fabricating an organic EL device capable of fabricating an organic EL device having a flexible substrate which does not damage the flexible substrate, the organic EL unit formed on the flexible substrate, and the peripheral lines, and with which the organic EL device is not adversely affected by the physical property of the magnetic film used for the temporary holding.

Solution to Problem

In one general aspect, the method for fabricating an organic electroluminescence (EL) device according to an aspect disclosed here feature a method for fabricating an organic electroluminescence (EL) device having a flexible substrate, the method including: forming an adhesive layer on a part of a surface of the flexible substrate; forming a magnetic material layer on the surface of the flexible substrate in a part other than the part on which the adhesive layer is formed; temporarily holding, using magnetic force, the flexible substrate on which the adhesive layer and the magnetic material layer are formed, above an inflexible substrate having magnetic property; fixing the flexible substrate with the inflexible substrate via the adhesive layer; forming a layer composing an organic EL unit on the flexible substrate temporarily held using the magnetic force and fixed via the adhesive layer; removing the part in which the flexible substrate and the inflexible substrate are fixed via the adhesive layer; separating the flexible substrate on which the layer composing the organic EL unit is formed from the inflexible substrate; and separating the magnetic material layer from the flexible substrate separated from the inflexible substrate, in which fixing the flexible substrate with the inflexible substrate via the adhesive layer is performed at the same time, before, or after temporarily holding the flexible substrate on the inflexible substrate using the magnetic force, and removing the part in which the flexible substrate and the inflexible substrate are fixed via the adhesive layer is performed at the same time or before separating the flexible substrate from the inflexible substrate.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The method for fabricating an organic EL device having a flexible substrate according to one or more exemplary embodiments or features disclosed herein provides fabrication of the organic EL device without damaging the flexible substrate, the organic EL unit formed on the flexible substrate, and the peripheral lines, and without adversely affecting the organic EL device by the physical property of the magnetic film.

BRIEF DESCRIPTION OF DRAWINGS

These and other advantages and features will become apparent from the following description thereof taken in conjunction with the accompanying Drawings, by way of non-limiting examples of embodiments of the present disclosure.

DESCRIPTION OF EMBODIMENT(S)

Figure 1:
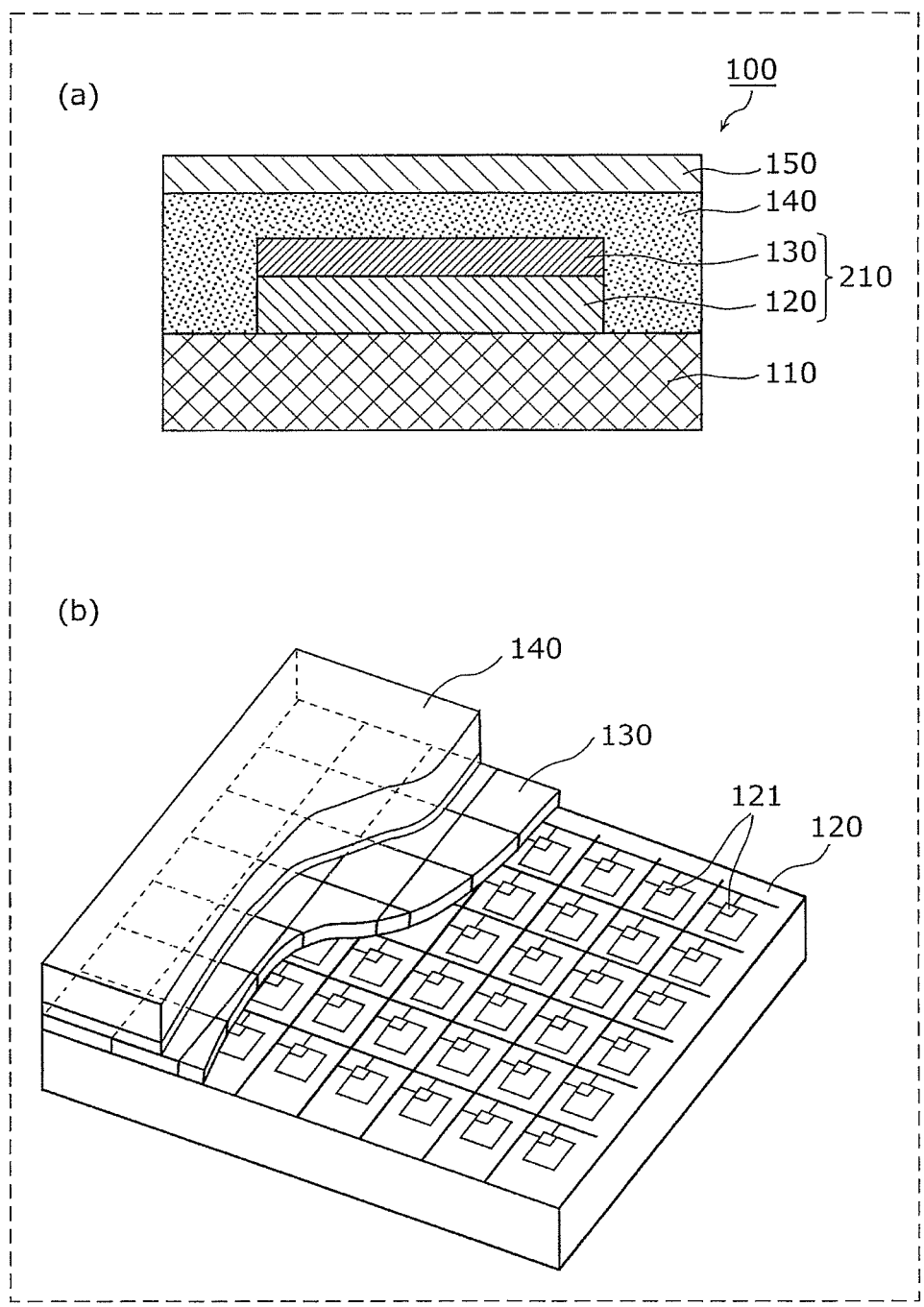
FIG. 1 illustrates a configuration of an organic EL device according to the first embodiment.

The method for fabricating the organic EL device according to the aspect of the present disclosure is a method for fabricating an organic electroluminescence (EL) device having a flexible substrate, the method including: forming a magnetic material layer on the surface of the flexible substrate; temporarily holding, using magnetic force, the flexible substrate on which the magnetic material layer is formed, above an inflexible substrate having magnetic property; forming a layer composing an organic EL unit on the flexible substrate temporarily held; separating the flexible substrate on which the layer composing the organic EL unit is formed from the inflexible substrate; and separating the magnetic material layer from the flexible substrate separated from the inflexible substrate.

According to this aspect, the flexible substrate on which the magnetic material layer is formed is temporarily held on the magnetic inflexible substrate using the magnetic force. Subsequently, a layer composing the organic EL device is formed on the flexible substrate. Subsequently, the flexible substrate having the layer on which the organic EL device is formed is separated from the inflexible substrate.

According to the present disclosure, the flexible substrate is temporarily held above the inflexible substrate using the magnetic force. Accordingly, it is extremely easy to separate the flexible substrate from the inflexible substrate, and the flexible substrate, the organic EL unit formed on the flexible substrate, and the peripheral lines are not damaged as in the case where the adhesive is used.

Furthermore, according to the present disclosure, a process for removing the magnetic material layer used for the temporary holding is included. Accordingly, the fabricated organic EL device does not include a magnetic material layer, and thus is not adversely affected by the physical property of the magnetic material layer.

In the method for fabricating the organic EL device according to the aspect of the present disclosure, the magnetic material layer is formed of a resin containing magnetic particles.

In the method for fabricating the organic EL device according to the aspect of the present disclosure the flexible substrate is formed of a resin.

In the method for fabricating the organic EL device according to the aspect of the present disclosure the inflexible substrate includes a magnet layer.

In the method for fabricating the organic EL device according to the aspect of the present disclosure the inflexible substrate further includes a glass substrate layer.

In the method for fabricating the organic EL device according to the aspect of the present disclosure the layer composing the organic EL unit includes at least one of an active device layer, a planarizing insulation layer, and an organic EL layer.

In the method for fabricating the organic EL device according to the aspect of the present disclosure, when separating the magnetic material layer from the flexible substrate, at least a part of the magnetic material layer is dissolved using a solvent.

The method for fabricating the organic EL device according to the aspect of the present disclosure includes forming an adhesive layer on a part of a surface of the flexible substrate; fixing the flexible substrate with the inflexible substrate via the adhesive layer; and removing the part in which the flexible substrate and the inflexible substrate are fixed via the adhesive layer; in which a magnetic material layer is formed on the surface of the flexible substrate in a part other than the part on which the adhesive layer is formed; fixing the flexible substrate with the inflexible substrate via the adhesive layer is performed at the same time, before, or after temporarily holding the flexible substrate on the inflexible substrate using the magnetic force, and removing the part in which the flexible substrate and the inflexible substrate are fixed via the adhesive layer is performed at the same time or before separating the flexible substrate from the inflexible substrate.

The following shall describe the display panel device and the display apparatus according to the embodiments. Note that, the following embodiment describes a specific example of the present disclosure. Numbers, shapes, material, components positional arrangements and connections of the components, steps, order of the steps described in the following embodiments are merely examples, and do not intend to limit the present disclosure. Furthermore, among the components in the embodiment, the components not recited in the independent claim which describes the most generic concept shall be described as optional components. Note that, the diagrams are schematic views, and the illustration is not always strictly accurate since part of the drawings may be emphasized for explanation purpose.

First Embodiment

FIG. 1 illustrates the configuration of an organic EL device 100 according to the first embodiment. The organic EL device 100 is a flexible display panel that can be bent freely. To put it differently, the organic EL device 100 is a display panel having flexible property.

FIG. 1 (a) is a cross-sectional view of the organic EL device 100. FIG. 1 (b) is a perspective view of part of the organic EL device 100.

The organic EL device 100 is an active-matrix display panel. Note that, the organic EL device 100 may be a passive-matrix display panel. The organic electroluminescence (EL) device 100 is an organic EL panel using an organic EL device.

The organic EL device 100 is a top-emission panel. Note that the organic EL device 100 may be a bottom-emission panel.

As illustrated in FIG. 1 (a), the organic EL device 100 includes a flexible substrate 110, an organic EL composing layer 210, a sealing layer 140, and a sealing member 150.

The flexible substrate 110 is a flexible substrate that can be bent freely. To put it differently, the flexible substrate 110 is a substrate having flexible property. The flexible substrate 110 is a resin substrate having polyimide as a major component. Stated differently, the flexible substrate 110 is formed of a resin.

Note that, the material for composing the flexible substrate 110 is not limited to polyimide. The material composing the flexible substrate 110 may be, for example, triacetylcellulose, polyethersulphone (PES), polyethylene terephthalate (PET), polyethylene naphthalate (PEN), and others. Note that, the flexible substrate 110 may be formed of multiple types of materials.

The organic EL composing layer 210 is a layer composing the organic EL unit. The organic EL unit is, for example, an organic light-emitting diode. The organic EL composing layer 210 is formed on the flexible substrate 110. The organic EL composing layer 210 serves as a display unit for displaying images.

The organic EL composing layer 210 includes an active device layer 120, an organic EL layer 130, and a planarizing insulation layer that is not illustrated.

The active device layer 120 is a layer in which active devices such as thin-film transistors (TFT) are formed. The active device layer 120 is formed on the flexible substrate 110. As illustrated in (b) in FIG. 1, the TFTs 121 are arranged in rows and columns.

The organic EL layer 130 is a layer which emits light.

Figure 2:
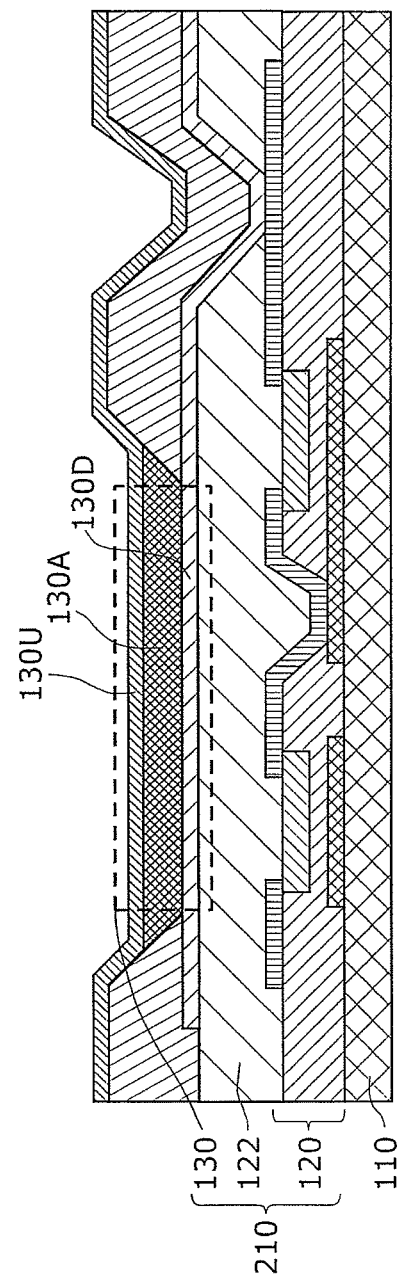
FIG. 2 is a cross-sectional view of a part of the organic EL composing layer corresponding to one pixel.

FIG. 2 is a cross-sectional view of the part of the organic EL composing layer 210 corresponding to one pixel. Note that, in FIG. 2, the flexible substrate 110 not included in the organic EL composing layer 210 is included for illustration purpose.

The organic EL composing layer 210 includes the active device layer 120, the organic EL layer 130, and a planarizing insulation layer 122. In other words, the organic EL composing layer 210 includes at least one of the active device layer 120, the planarizing insulation layer 122, and the organic EL layer 130.

The planarizing insulation layer 122 is a layer for electrically insulating the active device layer 120 from the organic EL layer 130.

The organic EL layer 130 includes an upper electrode 130U, an organic layer 130A, and a lower electrode 130D. The organic layer 130A is formed between the upper electrode 130U and the lower electrode 130D.

The upper electrode 130U and the lower electrode 130D are a cathode and an anode, respectively.

The lower electrode 130D is an electrode having light reflective property, and is formed on the planarizing insulation layer 122. The upper electrode 130U is a transparent electrode having light-transmitting property, and is formed on the organic layer 130A.

Note that, the upper electrode 130U and the lower electrode 130D may be the anode and the cathode, respectively.

A light-emitting unit is formed with the upper electrode 130U, the organic layer 130A, and the lower electrode 130D. The light-emitting unit is the organic EL unit. Multiple organic EL units arranged in rows and columns are formed in the organic EL layer 130.

Figure 3:
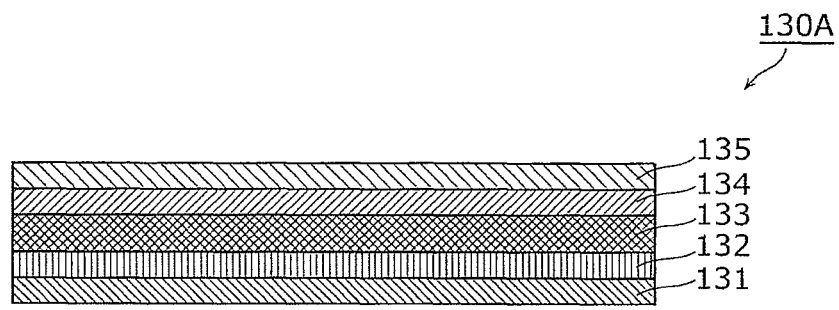
FIG. 3 is a cross-sectional view illustrating an example of the configuration of the organic layer.

FIG. 3 is a cross-sectional view illustrating an exemplary configuration of the organic layer 130A.

As illustrated in FIG. 3, the organic layer 130A includes a hole injection layer 131, a hole transport layer 132, a light-emitting layer 133, an electron transport layer 134, and an electron injection layer 135.

The hole injection layer 131 is a layer having a material with hole injection property as the major component, and is formed on the lower electrode 130D. The hole transport layer 132 is a layer having a material with the hole transport property as the major component, and is formed on the hole injection layer 131.

The light-emitting layer 133 is a layer having an organic light-emitting material which emits light when the hole and electron are recombined as the major component, and is formed on the hole transport layer 132.

The electron transport layer 134 is a layer having a material with hole transport property as the major component, and is formed on the light-emitting layer 133. The electron injection layer 135 is formed on the electron transport layer 134.

Note that, the configuration of the organic layer 130A is not limited to the configuration illustrated in FIG. 3. For example, the organic layer 130A may be composed of the hole injection layer 131, the hole transport layer 132, the light-emitting layer 133, and the electron transport layer 134.

With reference to FIG. 1 (a) and FIG. 1 (b) again, a sealing layer 140 is formed on the organic EL layer 130, and a sealing member 150 is formed on the sealing layer 140. The sealing member 150 is a member for preventing the moisture and oxygen in the air from entering the organic EL composing layer 210.

(Method for Fabricating Organic EL Device)

Next, the method for fabricating the organic EL device 100 shall be described.

Figure 4:
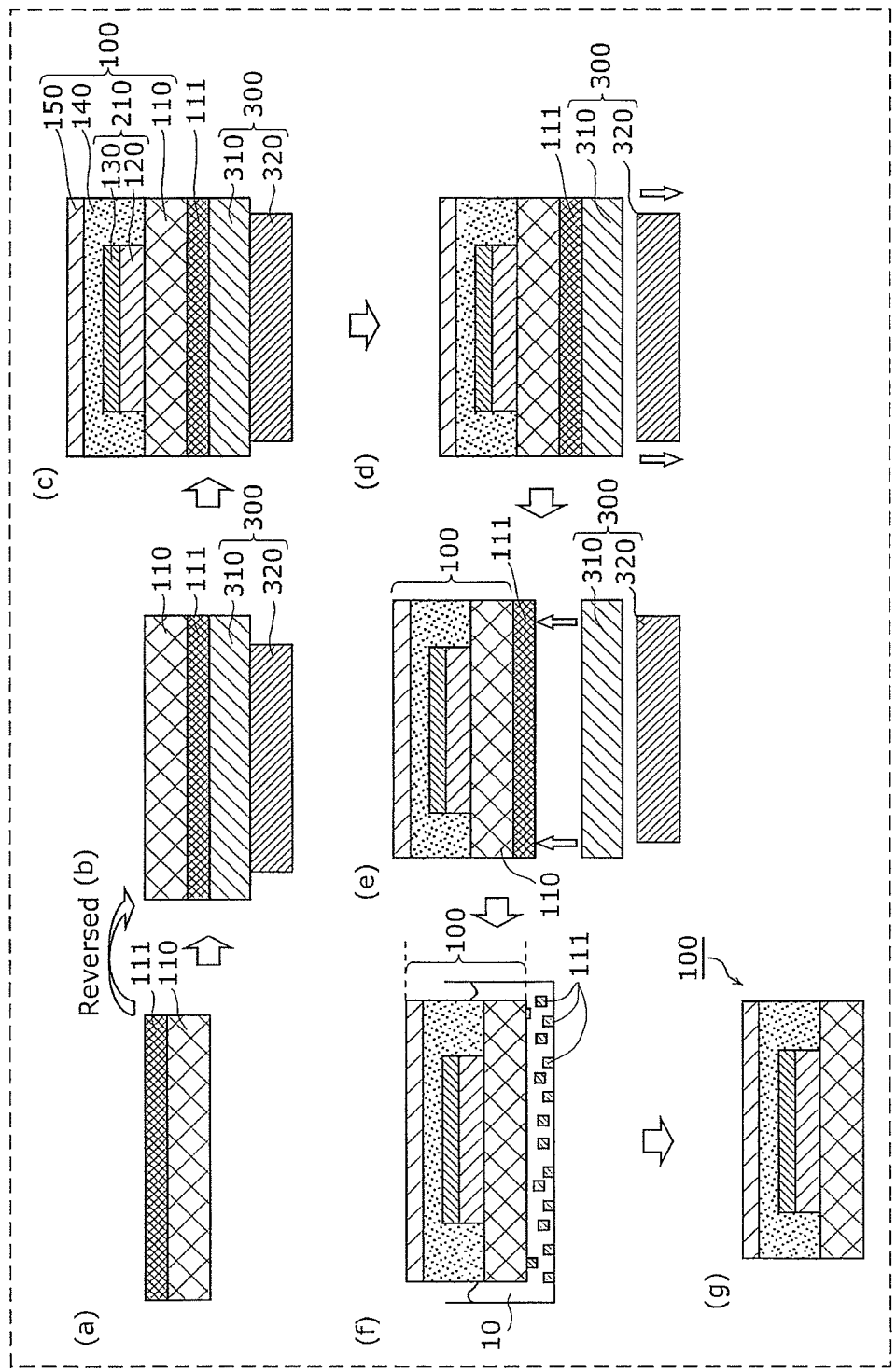
FIG. 4 is a diagram for illustrating a method for fabricating the organic EL device according to the first embodiment.

FIG. 4 is a diagram for illustrating the method for fabricating the organic EL device 100 according to the first embodiment.

Figure 5:
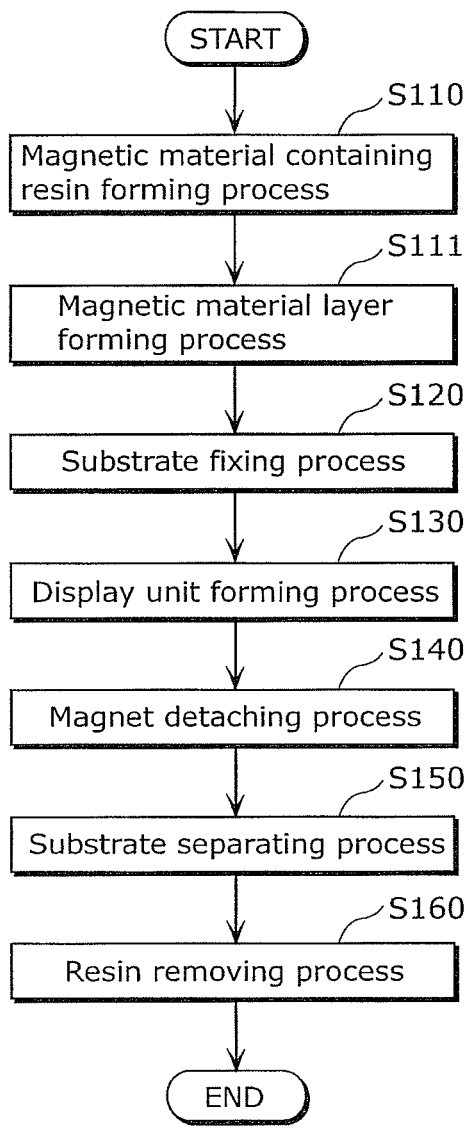
FIG. 5 is a diagram for illustrating a method for fabricating the organic EL device according to the first embodiment.

FIG. 5 is a flowchart illustrating an example of the method for fabricating the organic EL device 100 in the first embodiment.

Note that, the processes illustrated in the following description may be performed using a known processing technology. Accordingly, detailed description on processing condition shall be omitted where appropriate. Furthermore, the materials and processes illustrated in the following description is one typical example, and do not limit the organic EL device and the method for fabricating the organic EL device according to the present disclosure. The present disclosure includes cases in which other materials and processes known are used as suitable as well. The same applies to the fabrication method according to the second embodiment to be described later.

First, a magnetic material containing resin forming process is performed (S110). A magnetic material containing resin refers to a resin containing magnetic particles. The magnetic particles and the resin are used in the magnetic material containing resin forming process. The major components of the magnetic particles are ferrites, iron sand, and others. The resin is mostly composed of, for example, soluble polyimide.

In the magnetic material containing resin forming process, a magnetic material containing resin 111 illustrated in FIG. 4 (a) is formed by dispersing the magnetic particles in the resin. The magnetic material containing resin 111 is the magnetic material layer. More specifically, the magnetic material containing resin 111 as the magnetic material layer is formed of the resin containing the magnetic particles.

Next, the magnetic material layer forming process is performed (S111). In the magnetic material layer forming process, as illustrated in FIG. 4 (a), the magnetic material containing resin 111 as the magnetic material layer is applied on the surface of the flexible substrate 110.

Subsequently, the magnetic material containing resin 111 is cured by using ultraviolet (UV) light or others. More specifically, the magnetic material layer forming process is a process of forming the magnetic material layer (magnetic material containing resin 111) on the surface of the flexible substrate 110. In the following description, the flexible substrate 110 having a surface on which the magnetic material layer (magnetic material containing resin 111) is formed is also referred to as a magnetic material layer formed substrate.

Next, the substrate fixing process is performed (S120). In the substrate fixing process, the magnetic material layer formed substrate is fixed above the inflexible substrate 300, using the magnetic force. To put it differently, the inflexible substrate 300 is a substrate not having flexible property.

As illustrated in FIG. 4 (b), the inflexible substrate 300 includes a supporting substrate 310 and a magnet 320. The magnet 320 is an inflexible magnet. The magnet 320 composes the magnet layer. Stated differently, the inflexible substrate 300 includes the magnet layer.

As illustrated in FIG. 4 (b), in the inflexible substrate 300, the supporting substrate 310 is placed on the magnet 320. To put it differently, the inflexible substrate 300 is a substrate having magnetic property.

The supporting substrate 310 is an inflexible substrate. The supporting substrate 310 is mostly composed of glass. More specifically, the supporting substrate 310 composes the glass substrate layer. Stated differently, the inflexible substrate 300 includes a glass substrate layer.

Note that, the material composing the supporting substrate 310 is not limited to glass, but may be ceramic, silicon, and others.

Note that, one of the supporting substrate 310 and the magnet 320 may have flexible property, and the other of the supporting substrate 310 and the magnet 320 may have inflexible property.

More specifically, in the substrate fixing process, as illustrated in FIG. 4 (b), the inflexible substrate 300 is fixed under the magnetic material layer formed substrate that is reversed.

The reversed magnetic material layer formed substrate is a substrate including the flexible substrate 110 provided on the magnetic material containing resin 111, as illustrated in FIG. 4 (b). The inflexible substrate 300 is fixed under the reversed magnetic material layer formed substrate. This makes the flexible substrate 110 inflexible.

Note that, by a bonding force generated by the magnetic force of the magnetic material containing resin 111 and the magnetic force of the magnet 320 in the inflexible substrate 300, the inflexible substrate 300 is fixed under the reversed magnetic material layer formed substrate. To put it differently, no adhesive or others is used on a surface at which the supporting substrate 310 and the magnetic material containing resin 111 are closely attached.

In this case, even if the supporting substrate 310 and the magnet 320 are not adhered to each other by adhesive and others, the magnet 320 is fixed with the supporting substrate 310 by the bonding force generated by the magnetic force of the magnetic material containing resin 111 and the magnet 320 in the inflexible substrate 300.

Stated differently, the substrate fixing process is the process of temporarily holding the flexible substrate 110 on which the magnetic material layer (magnetic material containing resin 111) is formed with the inflexible substrate 300 having the magnetic property, using the magnetic force.

Next, the display unit forming process is performed (S130). In the display unit forming process, the organic EL composing layer 210 as the display unit is formed. More specifically, in the display unit forming process, the active device layer 120, the planarizing insulation layer 122, the organic EL layer 130 illustrated in FIG. 2 are formed on the flexible substrate 110 in this order. Here, the expression "on the flexible substrate 110" refers to on a surface of the flexible substrate 110 in which the magnetic material containing resin 111 is not formed.

With this, as illustrated in FIG. 2, the organic EL composing layer 210 is formed on the flexible substrate 110 (see FIG. 4 (c)).

More specifically, the organic EL composing layer 210 is formed on the flexible substrate 110 temporarily held by the magnet 320.

Subsequently, as illustrated in FIG. 4 (c), the sealing layer 140 is formed to cover the organic EL composing layer 210. Subsequently, the sealing member 150 is formed on the sealing layer 140.

With this, the organic EL device 100 is formed on the magnetic material containing resin 111.

Next, the magnet detaching process is performed (S140). In the magnet detaching process, as illustrated in FIG. 4 (d), the magnet 320 fixed with the supporting substrate 310 using the magnetic force is detached form the supporting substrate 310. Accordingly, the magnetic material containing resin 111 and the supporting substrate 310 can be easily separated.

Subsequently, the substrate detaching process is performed (S150). In the substrate separating process, as illustrated in FIG. 4 (e), the organic EL device 100 under which the magnetic material containing resin 111 is formed is separated from the supporting substrate 310 which is a part of the inflexible substrate 300. The organic EL device 100 includes the flexible substrate 110.

More specifically, the substrate separating process is a process for separating the flexible substrate 110 on which the organic EL composing layer 210 is formed from the inflexible substrate 300.

Next, a resin removing process is performed (S160). In the resin removing process, as illustrated in FIG. 4 (f), the magnetic material containing resin 111 is dissolved by soaking in a solvent 10. The solvent 10 is dimethylformamide (DMF). The magnetic material containing resin 111 may be dissolved using a method other than the method of soaking in the solvent 10, such as rinsing the magnetic material containing resin 111 with the solvent 10.

Stated differently, at least part of the magnetic material containing resin 111 as the magnetic material layer is dissolved by using the solvent. Stated differently, the resin removing process is a process for separating the magnetic material containing resin 111 as the magnetic material layer from the flexible substrate 110 separated from the inflexible substrate 300.

Note that, the solvent 10 is not limited to DMF, and may be other solvent capable of dissolving the magnetic material containing resin 111.

With the resin removing process, the fabrication of the organic EL device 100 ends (see FIG. 4 (g)).

According to the first embodiment described above, the inflexible substrate 300 is fixed under the magnetic material layer formed substrate including the flexible substrate 110. This makes the flexible substrate 110 inflexible. In this state, the organic EL composing layer 210 is formed on the flexible substrate 110. Accordingly, it is possible to form the organic EL composing layer 210 on the flexible substrate 110 highly accurately.

Subsequently, after the organic EL composing layer 210 is formed, the magnet 320 is detached from the supporting substrate 310. Subsequently, the magnetic material containing resin 111 and the supporting substrate 310 are separated. Subsequently, the magnetic material containing resin 111 is dissolved. With the processes described above, the organic EL device 100 is fabricated.

Accordingly, it is possible to fabricate the organic EL device without damaging the organic EL unit and the peripheral lines formed on the flexible substrate.

Furthermore, the organic EL device fabricated does not have the magnetic material layer used for the temporary holding. Accordingly, the organic material layer is not affected by the physical property of the magnetic material layer.

Second Embodiment

In this embodiment, the method for fabricating the organic EL device using the magnetic force and adhesive shall be described. The organic EL device fabricated by the fabrication method according to the second embodiment is the organic EL device 100 illustrated in FIG. 1 (a).
(Method for Fabricating Organic EL Device)

Next, the method for fabricating the organic EL device 100 shall be described.

Figure 6:
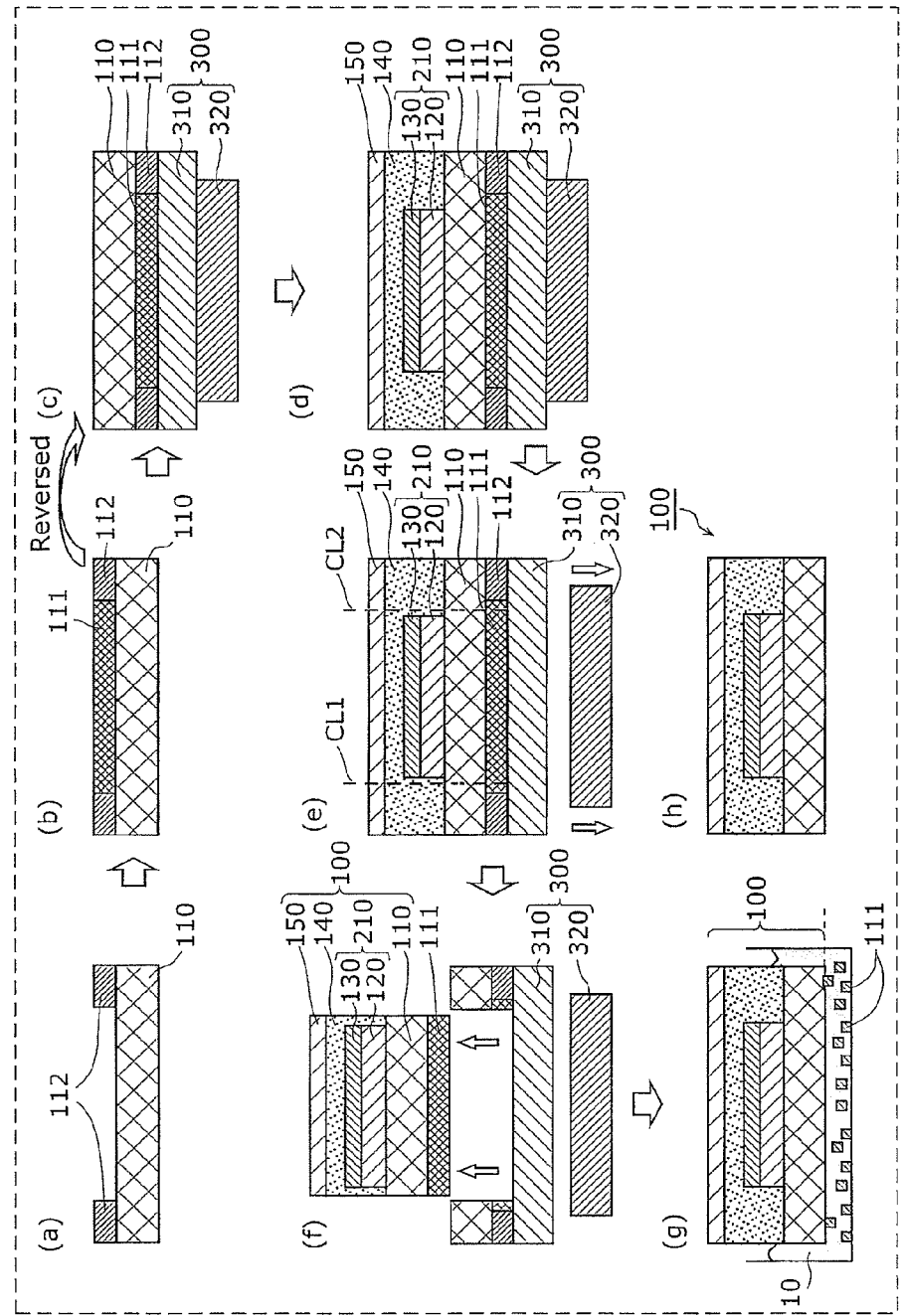
FIG. 6 is a diagram for illustrating a method for fabricating the organic EL device according to the second embodiment.

FIG. 6 is a diagram for illustrating the method for fabricating the organic EL device 100 according to the second embodiment.

Figure 7:
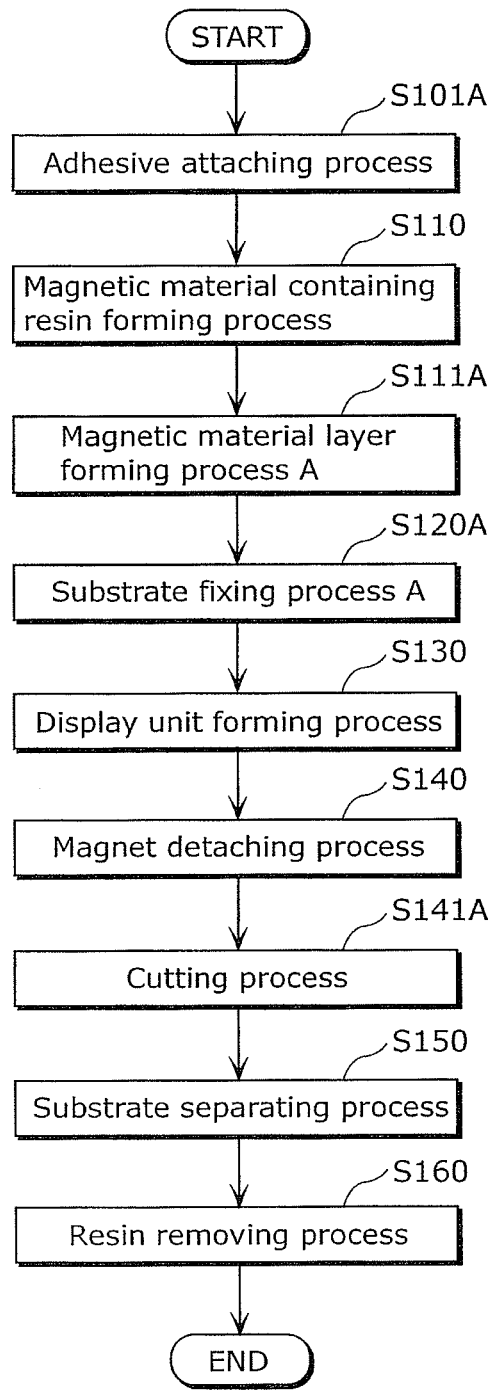
FIG. 7 is a diagram for illustrating a method for fabricating the organic EL device according to the second embodiment.

FIG. 7 is a flowchart illustrating an example of the method for fabricating the organic EL device 100 in the second embodiment. In FIG. 7, the processes with the same step numbers as the step numbers in FIG. 5 are identical to the processes described in the first embodiment. Accordingly, detailed description for these processes is not repeated.

First, the adhesive attaching process is performed (S101A). In the adhesive attaching process, an adhesive 112 is provided on the surface of end portions of the flexible substrate 110, as illustrated in FIG. 6 (a). More specifically, the adhesive 112 as the adhesive layer is formed on the surface of the end portions of the flexible substrate 110. The adhesive 112 is mostly composed of silicone.

More specifically, the adhesive 112 as the adhesive layer is formed on the surface of a part of the flexible substrate 110.

Note that, the material for the adhesive 112 is not limited to silicone, but may be another material used for bonding.

Note that, the positions on which the adhesive 112 are provided are not limited to the positions illustrated in FIG. 6 (a).

Next, a magnetic material containing resin forming process is performed (S110). In the magnetic material containing resin forming process, the same process as the first embodiment is performed. Accordingly, the detailed description is not repeated. With this process, the magnetic material containing resin 111 is generated.

Next, the magnetic material layer forming process A is performed (S111A). In the magnetic material layer forming process A, the magnetic material containing resin 111 as the magnetic material layer is applied on a surface of the flexible substrate 110 in a part other than the part on which the adhesive layer (the adhesive 112) is formed, as illustrated in FIG. 4 (b).

Subsequently, the magnetic material containing resin 111 is cured by using ultraviolet (UV) light or others. Subsequently, by the magnetic material layer forming process A, the magnetic material layer (the magnetic material containing resin 111) is formed on the surface of the flexible substrate 110 in a part other than the part on which the adhesive layer (the adhesive 112) is formed.

Next, the substrate fixing process A is performed (S120A). In the substrate fixing process A, the magnetic material formed substrate is fixed above the inflexible substrate 300 (bonded). The magnetic material layer formed substrate is the flexible substrate 110 having a surface on which the magnetic material layer (magnetic material containing resin 111) is formed as described above.

More specifically, in the substrate fixing process A, the inflexible substrate 300 is fixed under the reversed magnetic material layer formed substrate, as illustrated in FIG. 6 (c). More specifically, the substrate fixing process A is a process of fixing the flexible substrate 110 with the inflexible substrate 300 through the adhesive layer (adhesive 112).

Note that, at the same time as the substrate fixing process A, the flexible substrate 110 on which the magnetic material layer (the magnetic material containing resin 111) is formed is temporarily held with the inflexible substrate 300 having the magnetic property using the magnetic force. To put it differently, the substrate fixing process A and the substrate fixing process in FIG. 5 are performed at the same time.

Note that, the substrate fixing process A may be performed before or after the substrate fixing process. To put it differently, the substrate fixing process A is performed at the same time as, before, or after the substrate fixing process.

Next, the display unit forming process is performed (S130). Since the processes identical to the processes described in the first embodiment are performed, the detailed description for the display unit forming process is not repeated. With this process, the organic EL composing layer 210, the sealing layer 140, and the sealing member 150 are formed on the flexible substrate 110, as illustrated in FIG. 6 (d). Here, the expression "on the flexible substrate 110" refers to being on a surface of the flexible substrate 110 in which the magnetic material containing resin 111 is not formed.

Note that, the organic EL composing layer 210 is formed above the magnetic material containing resin 111. More specifically, the organic EL composing layer 210 is formed above the surface of the flexible substrate 110 in a part other than the part on which the adhesive layer (adhesive 112) is formed.

Next, the magnet detaching process is performed (S140). Since the processes identical to the processes described in the first embodiment are performed, the detailed description for the magnet detaching process is not repeated.

Next, a cutting process is performed (S141A). In the cutting process, the part along cutting lines CL1 and CL2 illustrated in FIG. 6 (e) is cut using a cutting member such as a cutter.

The cutting lines CL1 and CL2 are provided outside of the organic EL composing layer 210 and inside the adhesive layer (adhesive 112), as illustrated in FIG. 6 (e). The cutting lines CL1 and CL2 are provided upward from the surface of the supporting substrate 310.

Note that, the cutting lines CL1 and CL2 may be provided upward from the lower part of the magnetic material containing resin 111, such that the cutting lines CL1 and CL2 do not touch the surface of the supporting substrate 310 and a part of the magnetic material containing resin 111 can be cut.

With this cutting process, the organic EL device 100 having the magnetic material containing resin 111 formed in its lower part can be separated from the supporting substrate 310. In the following description, the organic EL device 100 having the lower part on which the magnetic material containing resin 111 is formed, illustrated in FIG. 6 (f) is referred to as a magnetic material containing resin holding panel.

Before the cutting process is performed, the flexible substrate 110 included in the magnetic material containing resin holding panel and the supporting substrate 310 which is a part of the inflexible substrate 300 are fixed by the adhesive layer (adhesive 112). Accordingly, the cutting process is a process for removing the part of the flexible substrate 110 and the inflexible substrate 300 fixed through the adhesive layer.

Next, the substrate separating process is performed in the same manner as the first embodiment (S150). In the substrate separating process, the magnetic material containing resin holding panel is separated from the supporting substrate 310, which is a part of the inflexible substrate 300.

Note that, the cutting process is not only performed before the substrate separating process, but may be performed at the same time as the substrate separating process. More specifically, the cutting process is performed at the same time or before the substrate separating process.

Next, a resin removing process is performed (S160). In the resin removing process, the same processes as in the first embodiment are performed. Accordingly, the detailed description for the processes is not repeated (see FIG. 6 (*g*)).

With the resin removing process, the fabrication of the organic EL device 100 ends (see FIG. 6 (*h*)).

According to the second embodiment described above, the inflexible substrate 300 is fixed under the magnetic material layer formed substrate including the flexible substrate 110. This makes the flexible substrate 110 inflexible. In this state, the organic EL composing layer 210 is formed on the flexible substrate 110. Accordingly, it is possible to form the organic EL composing layer 210 on the flexible substrate 110 highly accurately.

After the organic EL composing layer 210 is formed, the magnetic material containing resin 111 and the supporting substrate 310 are separated. Subsequently, the magnetic material containing resin 111 is dissolved. With the processes described above, the organic EL device 100 is fabricated.

Accordingly, in the second embodiment, the same effects achieved by the first embodiment can also be achieved. More specifically, it is possible to fabricate the organic EL device without damaging the organic EL unit and the peripheral lines formed on the flexible substrate, and the fabricated organic EL device is not affected by the physical property of the magnetic material layer.

Furthermore, in the second embodiment, the adhesive is used in addition to the magnetic force. Accordingly, it is possible to hold the flexible substrate more securely.

(External View of Display Apparatus)

Figure 8:
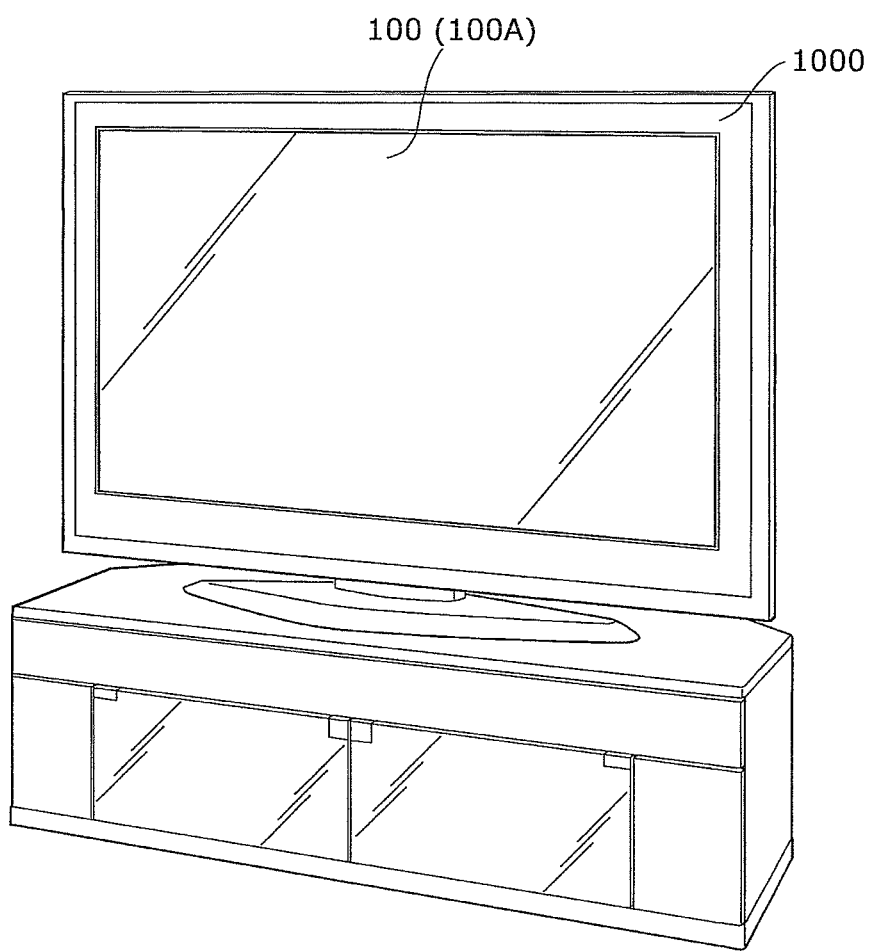
FIG. 8 is an external view of a display apparatus having the organic EL device.

FIG. 8 is an external view of the display apparatus 1000 including the organic EL device 100 or the organic EL device 100A.

Although only some exemplary embodiment of organic EL device according to the present disclosure has been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The herein disclosed subject matter is to be considered descriptive and illustrative only, and the appended Claims are of a scope intended to cover and encompass not only the particular embodiments) disclosed, but also equivalent structures, methods, and/or uses.

INDUSTRIAL APPLICABILITY

The present disclosure is applicable to a method for fabricating an organic EL device. With the method, the flexible substrate and the organic EL unit and the peripheral lines formed on the flexible substrate are not damaged in the fabrication process of the organic EL device having a flexible substrate, and the fabricated organic EL device is not affected by the physical property of the magnetic material layer.

The invention claimed is:

1. A method for fabricating an organic electroluminescence (EL) device having a flexible substrate, the method comprising:
    forming an adhesive layer on a part of a surface of the flexible substrate;
    forming a magnetic material layer on the surface of the flexible substrate in a part other than the part on which the adhesive layer is formed;
    temporarily holding, using magnetic force, the flexible substrate on which the adhesive layer and the magnetic material layer are formed, above an inflexible substrate having magnetic property;
    fixing the flexible substrate with the inflexible substrate via the adhesive layer;
    forming a layer composing an organic EL unit on the flexible substrate temporarily held using the magnetic force and fixed via the adhesive layer;
    removing the part in which the flexible substrate and the inflexible substrate are fixed via the adhesive layer;
    separating the flexible substrate on which the layer composing the organic EL unit is formed from the inflexible substrate; and
    separating the magnetic material layer from the flexible substrate separated from the inflexible substrate,
    wherein fixing the flexible substrate with the inflexible substrate via the adhesive layer is performed at the same time, before, or after temporarily holding the flexible substrate on the inflexible substrate using the magnetic force, and
    removing the part in which the flexible substrate and the inflexible substrate are fixed via the adhesive layer is performed at the same time or before separating the flexible substrate from the inflexible substrate.

2. The method for fabricating the organic EL device according to claim 1,
    wherein the magnetic material layer is formed of a resin containing magnetic particles.

3. The method for fabricating the organic EL device according to claim 1,
    wherein the flexible substrate is formed of a resin.

4. The method for fabricating the organic EL device according to claim 1,
    wherein the inflexible substrate includes a magnet layer.

5. The method for fabricating the organic EL device according to claim 4,
    wherein the inflexible substrate further includes a glass substrate layer.

6. The method for fabricating the organic EL device according to claim 1,
    wherein the layer composing the organic EL unit comprises at least one of an active device layer, a planarizing insulation layer, and an organic EL layer.

7. The method for fabricating the organic EL device according to claim 1,
    wherein when separating the magnetic material layer from the flexible substrate, at least a part of the magnetic material layer is dissolved using a solvent.

* * * * *